(12) United States Patent
Manley

(10) Patent No.: US 6,235,557 B1
(45) Date of Patent: May 22, 2001

(54) PROGRAMMABLE FUSE AND METHOD THEREFOR

(75) Inventor: Martin Manley, Saratoga, CA (US)

(73) Assignee: Philips Semiconductors, Inc., Tarrytown, NY (US)

( * ) Notice: Subject to any disclaimer, the term of this patent is extended or adjusted under 35 U.S.C. 154(b) by 0 days.

(21) Appl. No.: 09/301,186

(22) Filed: Apr. 28, 1999

(51) Int. Cl.[7] .................................................. H01L 21/82
(52) U.S. Cl. ..................... 438/132; 438/215; 438/281; 438/467; 438/601
(58) Field of Search .................................. 438/132, 215, 438/281, 333, 467, 601

(56) References Cited

U.S. PATENT DOCUMENTS

| | | | |
|---|---|---|---|
| 4,413,272 | * 11/1983 | Mochizuki et al. | 257/529 |
| 4,455,194 | 6/1984 | Yabu et al. . | |
| 4,536,949 | * 8/1985 | Takayama et al. | 257/529 |
| 4,628,590 | 12/1986 | Udo et al. . | |
| 5,444,012 | * 8/1995 | Yoshizumi et al. | 438/281 |
| 5,550,399 | * 8/1996 | Okazaki | 257/529 |
| 5,844,295 | * 12/1998 | Tsukude et al. | 257/529 |
| 5,972,756 | * 10/1999 | Kono et al. | 438/281 |

OTHER PUBLICATIONS

Thomas Clifton Penn, "New Methods of Processing Silicon Slices" Science , vol. 208 (May 23, 1980) pp. 923–926.*

* cited by examiner

*Primary Examiner*—Sara Crane

(57) ABSTRACT

A programmable fuse implements redundancy in semiconductor devices and enables the repair of defective elements. In an example embodiment, a fuse is built in the second-to-the-last metal interconnect layer used in the circuit. An opening to expose the fuse is incorporated into an existing mask of the last metal interconnect layer, typically the pad mask. The passivation layer on top of the bond pads is opened to expose the bonding pads. At the same time, a residual oxide window is defined over the fuse. The residual oxide covering the fuse provides for a reliable and reproducible fuse.

20 Claims, 5 Drawing Sheets

PROGRAMMABLE FUSE AND METHOD THEREFOR

FIELD OF INVENTION

This invention relates to the manufacture of semiconductor devices such as transistors, diodes, integrated circuits, and the like. More specifically this invention relates to a process for forming fuses in an integrated circuit.

BACKGROUND OF INVENTION

The total number of bits in semiconductor memory is approaching the gigabit range and beyond. Concurrent with the increase in memory capacity, the dimensions of the circuit components are decreasing. Consequently, the push for more capacity in a smaller space puts pressure on maintaining yield and reducing cost. One approach to improving yield and cost factors involves the use of built-in redundancy cells for replacement of memory arrays. During testing, if a defective cell is found, one of the built-in redundancy cells is configured to replace it. In one well-known process, fuses are used to provide such redundancy in semiconductor memories. If a semiconductor memory is found to have a small number of defective bits, these defects can be effectively overcome by exchanging the cells (as defined by rows and columns) containing the faulty bit locations with spare cells especially designed for this purpose. The address of the row or column that is exchanged and the location of the row or column is programmed into the memory circuitry during test. This is commonly done by opening (i.e., by "blowing" open the fuses) a number of fuses in a special section of the circuit. The fuses can be opened electrically, but it is usually more convenient to open them by subjecting the fuse to a high-intensity focused laser beam on a special probing system.

Any conductive material can be potentially used for the fusible element. For ease of incorporation into an existing integrated circuit, the most commonly used materials are the layer of poly-silicon which is used for the gate electrode, or one of the existing metal interconnect layers. The poly-silicon may be N-type or P-type depending upon the polarity of the transistor structure. A metal layer is usually preferred for the fuse due to its lower inherent resistance, which allows for faster reading of the fuse and faster memory access. The particular composition of the metal depends upon the process used. For example, a "metal" in a modern sub-micron process may be a "sandwich" of layers. The bottom layer has about 200 Å of titanium, a middle layer of 5000 Å of an aluminum/copper alloy and a top layer of about 300 Å of titanium nitride. Depending on the specifics of the process, other types of alloys and configurations may be used.

When the fuse is opened with the laser beam, a great deal of energy is transferred into the fuse, causing a rapid rise in temperature and vaporization of at least part of the fuse. The force of the blast forcibly expels vaporized parts of the fuse. In this way, the fuse changes from a conductive link to a non-conductive link The ease and reproducibility of blowing the fuse in this manner and the reliability of the fuse element once blown are all strongly dependent on the material covering the fuse.

In a conventional integrated circuit, the levels of metal that form the interconnect layers are each embedded in some form of deposited silicon dioxide to guarantee good electrical isolation between the conductors. The upper-most insulating layer, on top of the upper-most metal layer in the integrated circuit, also serves as a "passivation" layer. The passivation layer acts to protect the delicate integrated circuit from both mechanical damage and from the entry of foreign material (such as moisture or ionic contaminants) that might compromise the long-term reliability of the circuit. More commonly, the passivation layer on modern integrated circuits consists of a nitride layer deposited on the oxide layer in the circuit. The nitride layer is used because of its mechanical strength and its impermeability to moisture and ionic contaminants.

An example prior art process fabricates a semiconductor device on a wafer substrate. Upon the wafer substrate, an insulating layer is deposited. Typically, this insulating layer is silicon dioxide. However, other insulators may be used as well. Examples of insulating materials include silicon dioxide, silicon oxynitride, silicon oxyfluoride, silicon nitride, other oxides and nitrides, amorphous carbon, spin-on glasses (e.g., silicates, siloxanes, hydrogen silsesquioxane, and alkyl silsesquioxanes), polymers (e.g., polyimides and fluoropolymers), and other non-conductive materials.

FIG. 1A and FIG. 1B depict an example embodiment of a fuse in cross-section and top-view perspectives, respectively. In FIG. 1A, a device structure 100 has a fuse layer 120 on top of an oxide layer 110. Covering the fuse layer 130 is second oxide layer 130. Upon the second oxide layer 130 is a nitride layer 140.

Photolithography and etching define a fuse layer of a conductive material along with other conductive interconnect (e.g., component-to-component connection within the IC). Such conductive materials may include doped poly-silicon or metal alloys of aluminum, copper, or others. In an example process, the shape of the fuse layer usually has a "dog bone" appearance as shown in FIG. 1B. However, the geometry of the fuse is not limited to any particular form. The form is governed by the needs of the process and application. As is well known, designers are able to design varying valued resistor structures by patterning layers in a variety of different shapes designed to fit well within a particular design layout. By way of example, the resistance "R" of a patterned shape is determined by multiplying the ratio of ("length"/"width") by the resistivity expressed in terms of sheet resistance (i.e., [(L/W)×/]=). The final shape of the fuse determines how much current it may carry, the amount of energy required to open the fuse, and the long-term reliability of the fuse.

Referring to FIG. 1B, a typical implementation of a fuse layer 120 on device structure 100 is shown. Nitride layer 140 is the upper-most layer. For further information on manufacturing and testing of fuses, reference may be made to U.S. Pat. No. 4,455,194 of Yabu et al, "Method for Producing a Semiconductor Device" and U.S. Pat. No. 4,628,590 of Udo et al, "Method of Manufacture of a Semiconductor Device," each incorporated by reference.

For the design of reliable and reproducible fuses, the top passivation layer of the integrated circuit is often a major consideration. For fuse optimization, it is preferable that there not be any nitride film on top of the film. This is because the mechanical robustness of the nitride film tends to resist the vaporization of the fuse material, making it hard to blow the fuse. If sufficient energy is coupled into the fuse to overcome this resistance, the vaporization of the fuse is more explosive, and may tend to damage nearby circuit elements. For this reason, it is usually preferable to remove the nitride layer in the immediate region over the fuse.

Some implementations choose to remove the nitride layer, but leave a layer of silicon dioxide on top of the fuse. One reason is that it improves the integrity of the protective seal on top of the integrated circuit. Because the majority of the fuses in any memory will not be blown, it is desirable that they remain covered with a protective layer of oxide in order to provide a degree of mechanical and chemical protection. A second reason relates to the reliability of fuse blowing. If there is no encapsulating layer on top of the fuse trying to contain the vaporized metal, the fuse can be melted and blown with a relatively small amount of laser energy. If the fuse is blown in this way, the vaporized metal may not be forcibly expelled and may be re-deposited in the vicinity of the remaining fuse body. Over time, this type of structure may tend to become more conductive, and pose a reliability risk to the functionality of the circuit.

In one prior art approach, a circuit is tested while a first passivation film covering a semiconductor substrate, on which circuit elements such as transistors, capacitors and the like are formed, is partially open over the fuses and bonding pads thereof. The fuses are opened, if necessary to wire in the redundant circuit elements. A second passivation film is then formed so as to cover the exposed portions of the fuses and bonding pads. Any cracks in the fuses and bonding pads are thus covered by the second passivation film to prevent their exposure. In this manner, invasion of moisture or the like below the fuses and the bonding pads can be prevented, and moisture proofing as well as the reliability of the semiconductor device can be improved.

The aforementioned process may require that the wafers be removed from the "clean room" environment of the wafer fabrication facility (wafer fab), be tested in a "notso-clean" wafer probe test, and be re-introduced back into the wafer fab for subsequent passivation. These wafers may be re-tested to assure that later process steps do not introduce fatal defects into the devices. Such re-testing reduces the likelihood of packaging failing devices.

In another prior art process of forming a metal fuse and removing the nitride layer, the fuse body is defined in the uppermost level of the metal interconnect on top of a dielectric, usually an oxide, that is available in the integrated circuit. It is then covered by the passivation oxide layer and nitride layer. An additional masking step is performed to open an area immediately on top of the fuse. A special nitride etch is performed to remove the upper nitride layer, but stop on the underlying oxide layer. The resulting structure, after resist removal, is suitable for fuse reliability (a metal fuse covered only with oxide). However, this comes at the expense of adding extra masking and etching steps to the fabrication sequence.

As the number of metal layers used is increased, the building of a suitable fuse covered only with oxide without adding process steps and increasing cost becomes problematic.

SUMMARY OF INVENTION

The present invention provides for the manufacturing of a reproducible and reliable fuse structure useful in semiconductor devices. It is exemplified in a number of implementations, several of which are summarized below. According to one embodiment, a fuse in a semiconductor device is manufactured by forming a fuse having an insulated portion and an exposed portion. Next, the exposed portion of the fuse is covered with a first insulator. A second insulator is formed over the first insulator. The second insulator is selectively removed and the first insulator is exposed via an aperture above the fuse.

In another embodiment, a method forms a fuse in a second-to-the-last metal interconnect layer. The semiconductor device has at least two metal interconnect layers. First a fuse is formed in the second-to-the-last metal interconnect layer. Following the fuse formation, a first oxide layer is formed over the fuse. Next, a last metal interconnect metal layer is deposited on the first oxide layer and a bonding pad is formed. A second oxide layer is formed over the bonding pad and the first oxide layer. A nitride layer is formed over the second oxide layer. Masking defines a first aperture over the fuse and a second aperture over the bonding pad. A first etchant removes the nitride layer in the first and second apertures. A second etch removes the second oxide layer in the first and second aperture until the bonding pad is exposed.

In yet another embodiment, a method forms a fuse in a second-to-the-last metal interconnect layer, wherein the second-to-the-last interconnect layer is on a substrate insulating layer. The semiconductor device has at least two metal interconnect layers. First, a fuse is formed in the second-to-the-last metal interconnect layer. Next, a first oxide layer is formed over the fuses and the insulating layer. Following the formation of the first oxide layer, the process deposits a last metal interconnect layer on the first oxide layer. From the last metal interconnect layer the process forms a bonding pad. Then a second oxide layer is formed over the first oxide layer and the plurality of bonding pads. Upon the second oxide layer a nitride layer is formed. Through masking, a first aperture is defined over the fuse and a second aperture is defined over the bonding pad. With a first etchant, the nitride layer is etched in the first and second apertures until the nitride layer is removed therefrom. The first etchant is changed to a second etchant, and etching is resumed in the second oxide layer in the first and second aperture until the bonding pad is exposed. Next, a first group of fuses is put into a first state and a second group of fuses different from the first group of fuses being put into a second state, the electrical resistance of the first group of the fuses is much greater than that of the fuses in the second state.

In yet another embodiment, a method forms an integrated circuit having redundancy. First, the method forms a semiconductor array of memory cells arranged in rows and columns, with each memory cell to be accessed in response to levels established on selected ones of row and bit lines. Next, a fuse-link circuit coupled to certain ones of the row and bit lines is formed. The fuse-link is manufactured by forming a fuse having an insulated portion and an exposed portion. The exposed portion of the fuse is covered with a first insulator. Over the first insulator, the method forms a second insulator. Selectively removing the second insulator and exposing the first insulator via an aperture above the fuse layer completes the fuse-link. One or more defective memory cells in the array may be repaired by the opening of one or more fuse-links.

The above summary of the present invention is not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which.

Figure 1A:
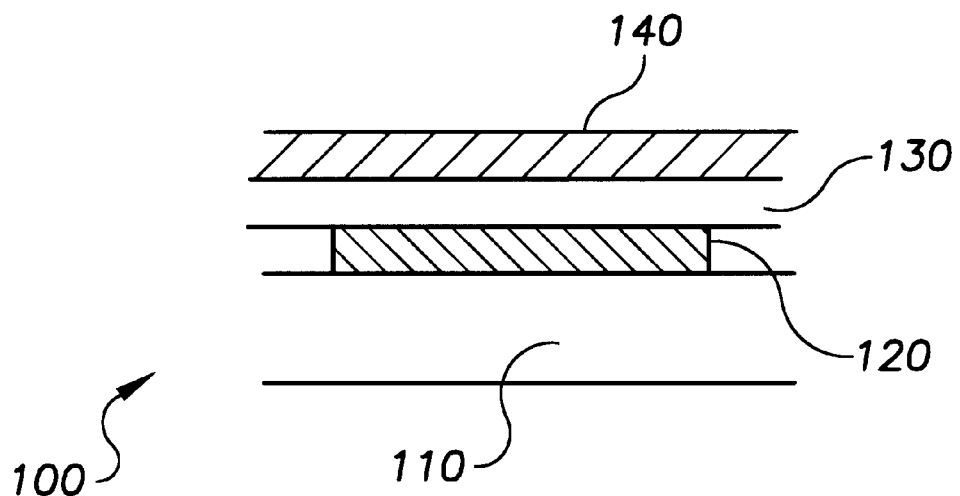
FIG. 1A illustrates a cross-sectional view of a prior art metal fuse structure having an oxide and nitride passivation manufactured in a conventional process.
Figure 1B:
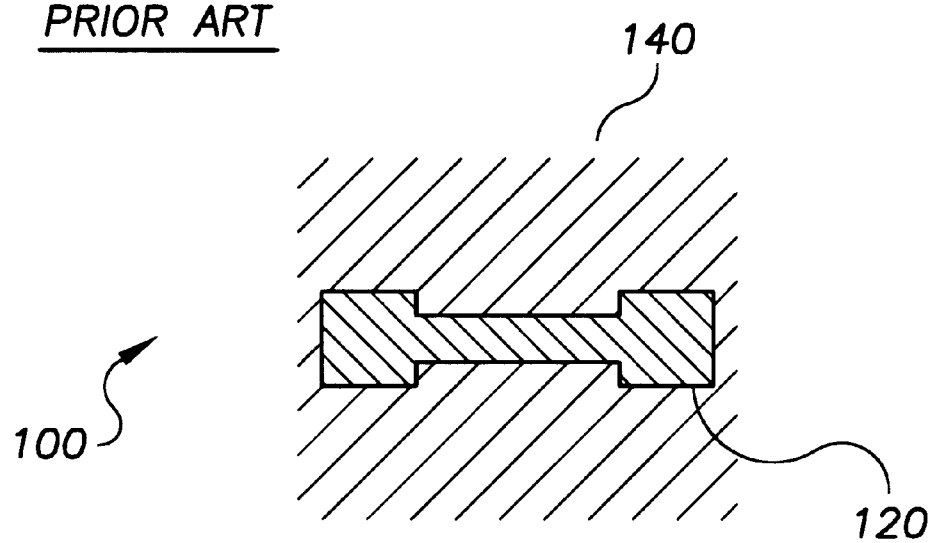
FIG. 1B illustrates a top view of the fuse depicted in FIG. 1A.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DETAILED DESCRIPTION

The present invention has been found useful and advantageous in connection with manufacturing fuses in a semiconductor device. According to the present invention, a fuse layer is defined and then a first insulating layer is deposited on the fuse layer and the insulating layer that had previously been deposited on the wafer substrate. Usually, this layer is silicon dioxide. Next, a second insulating layer is deposited in the first insulating layer. Typically, the second insulating layer is silicon nitride or it may be of composite layers of oxide and nitride. In three different example processes, the nitride is deposited at thicknesses of between 500 Å and 3000 Å, and between about 1000 Å to 2500 Å, and about 2000 Å. Like the substrate insulating layer, the first and second insulating layers may be of other suitable insulating materials.

Having deposited the first and second insulating layer over the fuse layer, the process etches the second insulating material until the first insulating material is exposed to form a window above the fuse layer. If the second insulating layer is silicon nitride, an etch selective to silicon nitride is used. Typically, a hot phosphoric acid etch is used. The remaining structure is a fuse layer covered only by an oxide. Such a structure produces a reliable and reproducible fuse.

In an example embodiment according to the present invention, the process defines fuses in the "second-to-the-last" metal layer of all the metal interconnect layers used in the circuit. In an example five metal layer process, the fuse layer is built in the fourth metal interconnect layer. The fifth metal layer, "the last metal," includes the bonding pads.

According to a conventional process flow, an oxide layer is formed on top of the metal layer that defines the fuses, and the final layer of metal is deposited and patterned. An oxide layer is deposited on top of the upper-most ("final") metal layer, the layer where the bonding pads are usually defined. Then, a nitride layer is deposited. As part of the conventional process flow, the "pad" mask is now defined in photoresist on top of the wafer, and a nitride etch is performed, followed by an oxide etch. These etches are designed to stop on bonding pads formed in the top layer of metal, so as to allow electrical contact to be made to the pads during wafer probing, wire bonding, and packaging. According to this invention, openings on top of the fuses are incorporated into the "pad" mask. With the oxide thickness and etch parameters that are used in a standard integrated circuit process, the subsequent etches will result in the nitride layer overlying the metal fuses being removed, but a residual oxide layer being left in place.

Referring to FIGS. 2A–2H, an example

According to a conventional process flow, an oxide layer is formed on top of the metal layer that defines the fuses, and the final level of metal is deposited and patterned. An oxide layer is deposited on top of the upper-most ("final") metal layer, the layer where the bonding pads are usually defined. Then, a nitride layer is deposited. As part of the conventional process flow, the "pad" mask is now defined in photoresist on top of the wafer and a nitride etch is performed followed by an oxide etch. These etches are designed to stop on bonding pads formed in the top level of metal so as to allow electrical contact to be made to the pads during wafer probing, wire bonding, and packaging. According to this invention, openings on top of the fuses are incorporated into the "pad" mask. With the oxide thickness and etch parameters that are used in a standard integrated circuit process, the subsequent etches will result in the nitride layer overlying the metal fuses being removed, but a residual oxide layer being left in place.

Referring to FIGS. 2A–2H, an example process illustrates the steps in forming a fuse structure while the bonding pads are being defined. The applicable process technology governs the specific shape and properties of the fuse.

Figure 2A:
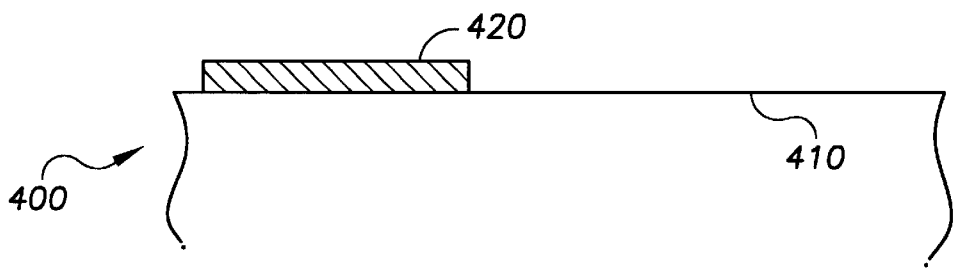
FIGS. 2A–2H illustrate an example embodiment of the method for making a fuse structure according to the present invention.

Referring to FIG. 2A, the fuse layer 420 built during the fourth metal layer of a five layer metal process, is deposited on an inter-metal oxide (IMO) layer 410 of a substrate 400. In one example approach, the metal thickness may range from five to eight microns. The IMO layer may range from one to one and one half microns. On the fourth metal layer, photolithography defines the desired circuit pattern and as needed, the fuse layer 420.

Figure 2B:
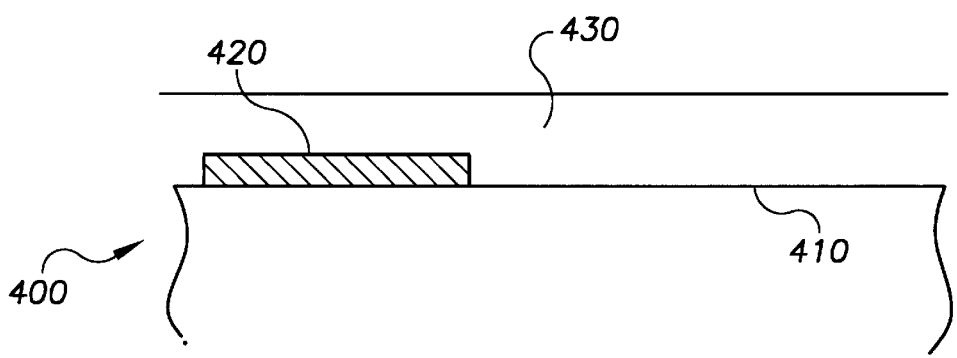
Figure 2C:
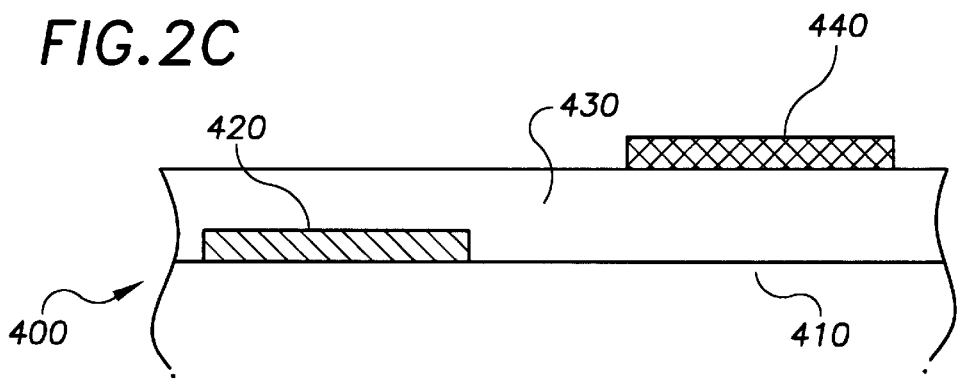

Referring to FIG. 2B, the process deposits an additional IMO layer 430. The fifth metal layer 440 is then deposited. Bonding pads 440 and other interconnects (not shown) are defined in the fifth metal layer (not shown) in FIG. 2C.

Figure 2D:
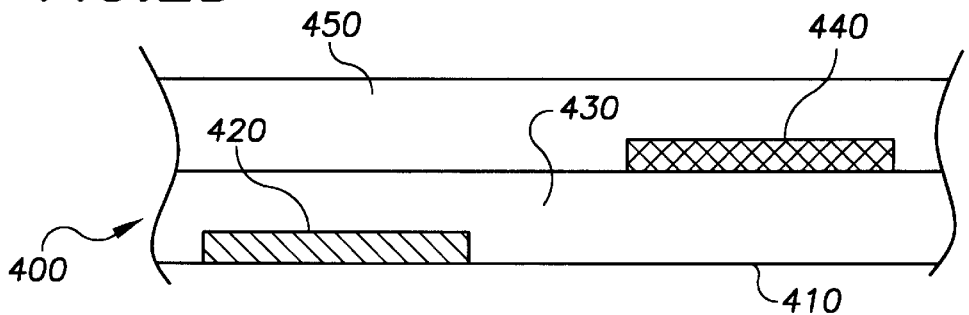
Figure 2E:
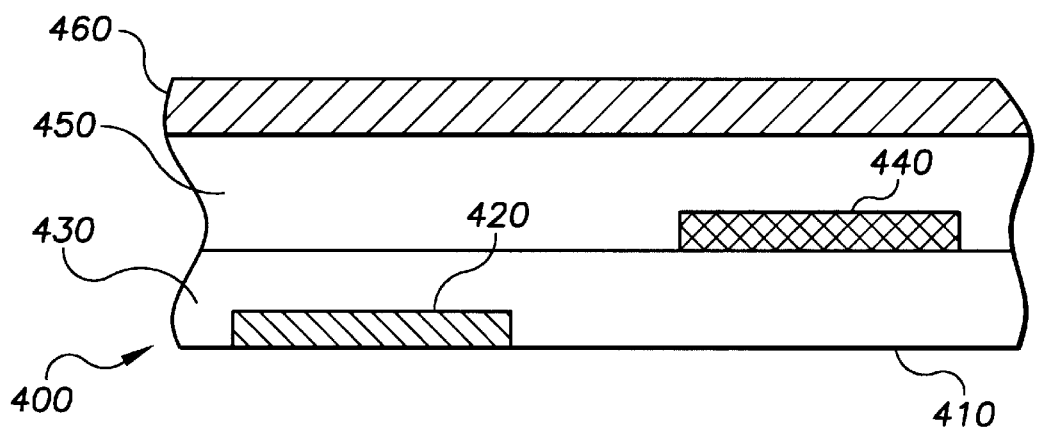

As Illustrated in FIG. 2D, upon the bonding pad 440 a passivation oxide 450 is deposited. Passivation nitride 460 is deposited upon the passivation oxide 450 as shown in FIG. 2E. After depositing the passivation nitride 460, photoresist is applied on the nitride layer's surface. Through conventional photo-lithographic techniques, openings are defined over the bonding pads 440 and fuse layer 420.

Figure 2F:
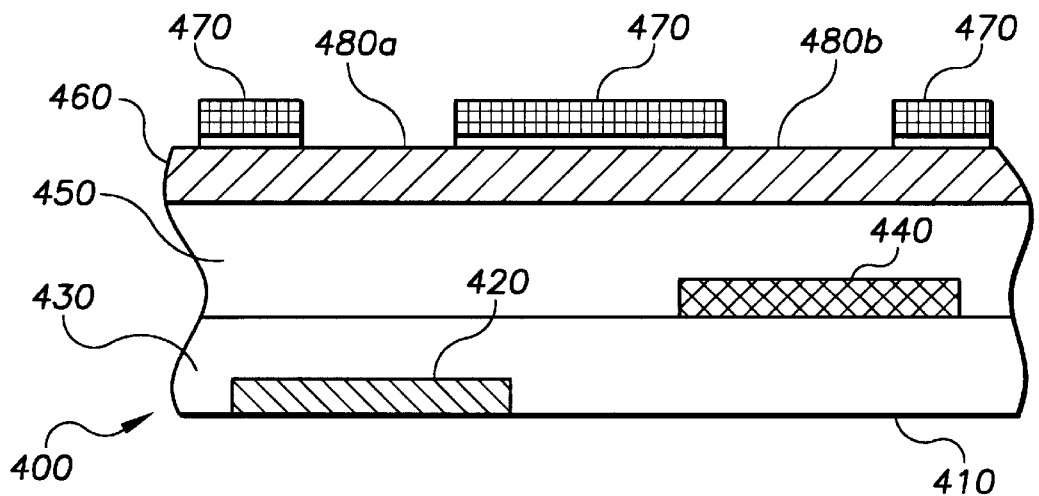
Figure 2G:
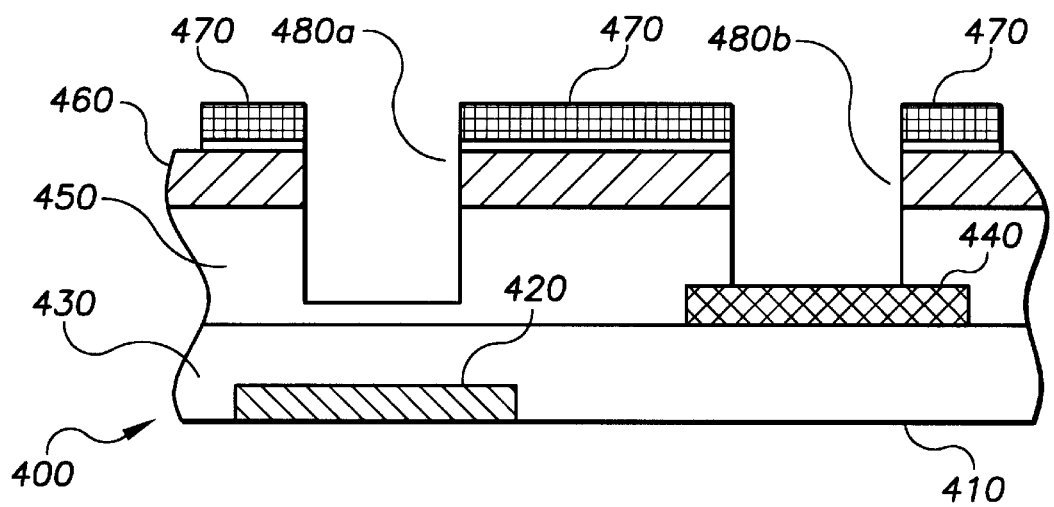

Referring the FIG. 2F, a fuse layer window 480a and a bonding pad opening 480b are defined via a mask 470. Through a nitride etch process, the nitride layer 460 is removed, followed by an oxide etch to remove oxide layer 450. Oxide etching proceeds until the metal of the bonding pad 440 is exposed, as shown in FIG. 2G.

Figure 2H:
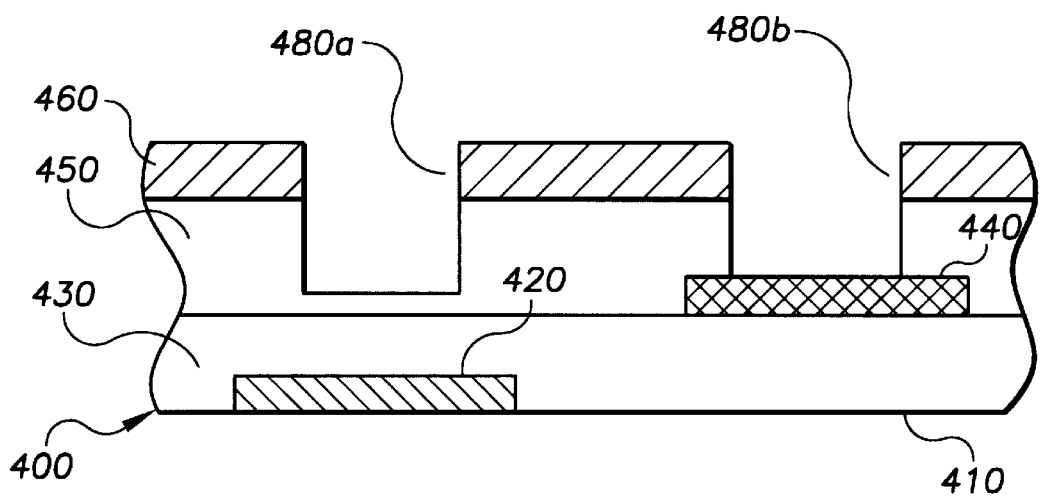

The photoresist layer 470 may be removed using any of a variety of techniques including, for example, selective etching or ashing (particularly if the photoresist layer is made using an organic photoresist). For example, the photoresist can be "burned" off by etching it in an oxygen plasma. The resulting structure is shown in FIG. 2H. The desired structure, a fuse covered by an oxide layer has been defined.

Having achieved the desired structure, the devices on the wafer undergo probe test and circuit repair by opening fuses to connect the redundant repair circuits. The wafer probe may be equipped with a laser to open fuses. If the semiconductor device is so designed, the fuses may also be opened with an electrical signal.

In an example application of the invention, memory devices built according to aforementioned described methods may undergo a number of steps. The wafer fabrication process has manufactured silicon wafers having memory devices with the novel fuses. Wafers are typically carried and stored in cassettes of about 25 wafers. Depending upon the yield within the fabrication lines, the total number wafers for a given run of wafers (usually designated on a cassette-by-cassette basis) may be less than 25 wafers. Wafers stored in cassettes are taken from the "clean-room" environment to a testing area, often called the "test floor." The cassette is loaded into a laser-equipped probing station connected to automatic test equipment (ATE). The ATE is set-up with a program to exercise the device with a number of tests of functionality and parametrics. Typically, the first tests applied verify the gross connectivity of the device, and whether the power and ground rails or input/output pads are open or shorted.

After completing the above tests, memory undergoes functional and parametric testing. Functional tests may include "all ones," "all zeroes," diagonals, checkerboard, and others. Parametric tests may include the verifying of input and output leakage currents, the quiescent current, input/output timing relationships, etc. Testing of memory is well-established in the art. Having completed a typically exhaustive series of tests, the device may encounter a small number of bad bits. Were it not for these bad bits the device would pass.

The ATE program replaces these bad memory cells with the redundant cells by instructing the laser-equipped probe to open the appropriate fuses to disconnect the bad bits from the memory array and replace them with spares. In addition, the ATE reprograms the logic needed to access these bits. From a user's standpoint, the repaired memory array behaves the same as one without repaired cells.

The probe sorts out useable dice and discards non-repairable dice. Since the fuses already have a passivation, no further wafer fab processing is required. If the ATE wafer test program is sufficiently exhaustive, it is likely that the redundancy-equipped memory built according to the one of the example embodiments need only be probed once. Useable dice are later packaged.

Figure 3:
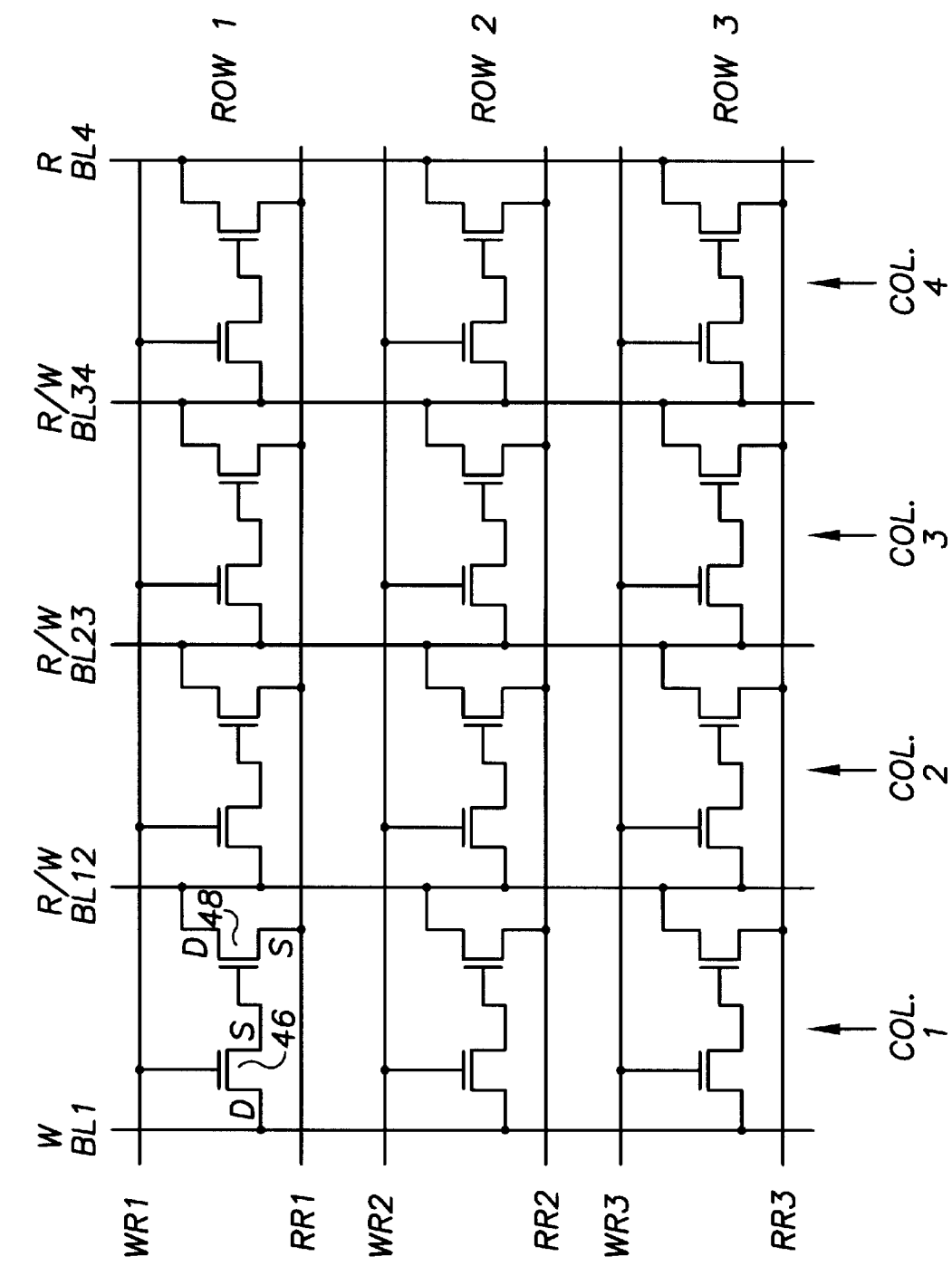
FIG. 3 illustrates a schematic diagram of a portion of a memory array; according to an example embodiment of the present invention.

Built-in redundancy in a memory array may be applied to a number of configurations. For example, the programmable fuse according to one of the example embodiments of the present invention may be incorporated into a semiconductor chip having a memory circuit and a semiconductor memory cell array accessed (written to and read from) using rows and columns. FIG. 3 provides a portion of a memory array having twelve cells implemented as three rows and four columns. The cells of the array are labeled by row (1 through 3) and column (1 through 4) and will be referred to as cell accordingly. Each of the cells is similarly constructed using two bit lines and two row lines and using a write transistor and a read transistor. Each memory cell within the array stores a data bit as one of two logic levels. According to a more specific example embodiment, a bit line is shared between two adjacent memory cells. During a write operation, the shared bit line is used with one of the adjacent memory cells, and during a read operation, the same shared bit line is used for the other of the two adjacent memory cells. For further information regarding such circuits generally and one particular memory array useful in connection with the above embodiment, reference may be made to U.S. Pat. No. 6,072,713, entitled "Data Storage Circuit Using Shared Bit Line and Method Therefor," and of U.S. Pat. No. 6,021,064, entitled "Layout for Data Storage Circuit Using Shared Bit Line and Method Therefor," both filed on Feb. 4, 1998, and U.S. Pat. No. 09/069,429, entitled "Arrangement and Method for DRAM Cell Using Shallow Trench Isolation, filed on Apr. 29, 1998, all assigned to the instant assignee and herein incorporated by reference in their entirety.

While the present invention has been described with reference to several particular example embodiments, those skilled in the art will recognize that many changes may be made thereto without departing from the spirit and scope of the present invention, which is set forth in the following claims.

What is claimed:

1. A method of forming a fuse in a second-to-the-last metal interconnect layer, the second-to-the-last metal interconnect layer of a semiconductor device substrate having at least two metal interconnect layers comprising:

forming the fuse in the second-to-the-last metal interconnect layer;

forming a first oxide layer over the fuse;

depositing a last metal interconnect layer on the first oxide layer and forming a bonding pad therefrom;

forming a second oxide layer over the bonding pad and the first oxide layer;

forming a nitride layer over the second oxide layer;

masking the nitride layer to define a first region over the fuse and a second region over the bonding pad; and etching the nitride layer in the first and second region with a first etchant until the nitride layer is removed to form apertures in the first and second region, changing to a second etchant and resuming etching in the second oxide layer in the first and second region until the bonding pad is exposed.

2. The method of forming a fuse as recited in claim 1 wherein in an N metal layer process, the second-to-the-last metal layer is an $(N-1)^{th}$ metal layer and the last metal layer an $N^{th}$ metal layer wherein N is an integer greater than two.

3. The method of forming a fuse as recited in claim 1 wherein in a five metal layer process, the second-to-the-last metal layer is a fourth metal layer and the last metal layer is a fifth metal layer.

4. The method of forming a fuse as recited in claim 1 wherein in a four metal layer process, the second-to-the-last metal layer is a third metal layer and the last metal layer is a fourth metal layer.

5. The method of forming a fuse as recited in claim 1 wherein in a three metal layer process, the second-to-the-last metal layer is a second metal layer and the last metal layer is a third layer.

6. The method of claim 1 wherein the second-to-last and the last metal interconnect layers includes using alloys selected from at least one of the following: aluminum, copper, titanium, tungsten, platinum, molybdenum, cobalt, and tantalum.

7. A method of manufacturing a semiconductor device having a second-to-the-last metal interconnect layer, the second-to-the-last metal interconnect layer on an insulating layer of a semiconductor device substrate having at least two metal interconnect layers comprising:

forming fuses in the second-to-the-last metal interconnect layer;

forming a first oxide layer over the fuses and the insulating layer;

depositing a last metal interconnect layer on the first oxide layer and forming at least one bonding pad therefrom;

forming a second oxide layer over the plurality of the bonding pad and the first oxide layer;

forming a nitride layer over the second oxide layer;

masking the nitride layer to define a first region over the fuse and a second region over the bonding pad;

etching the nitride layer in the first and second region with a first etchant until the nitride layer is removed to form apertures in the first and second region, changing to a second etchant and resuming etching in the second oxide layer in the first and second region until the bonding pad is exposed; and putting a first group of the fuses into a first state and a second group of the fuses different from the first group of fuses into a second state, the electrical resistance of the first group of the fuses being much greater than that of the fuses in the second state.

8. The method of manufacturing a semiconductor device as recited in claim 7 wherein in an N metal layer process, the second-to-the-last metal layer is an $(N-1)^{th}$ metal layer and the last metal layer is an $N^{th}$ layer, wherein N is an integer greater than two.

9. The method of claim 7 wherein the second-to-last and the last metal interconnect layers includes using alloys selected from at least one of the following: aluminum, copper, titanium, tungsten, platinum, molybdenum, cobalt, and tantalum.

10. The method of manufacturing a semiconductor device as recited in claim 7 wherein putting the first group of fuses into the first state comprises using a laser beam to open the first group of fuses.

11. The method of manufacturing a semiconductor device as recited in claim 7 wherein putting the first group of fuses into the first state comprises using an electrical current to open the first group of fuses.

12. A method of manufacturing a semiconductor device having a second-to-the-last metal interconnect layer, the second-to-the-last metal interconnect layer on a substrate insulating layer of a semiconductor device substrate having at least two metal interconnect layers comprising:

forming fuses in the second-to-the-last metal interconnect layer;

forming a first dielectric layer over the fuses and the substrate insulating layer;

depositing a last metal interconnect layer on the first dielectric layer and forming at least one bonding pad therefrom;

forming a second dielectric layer over the bonding pad and the first dielectric layer;

forming a third dielectric layer over the second dielectric layer;

masking the third layer to define a first region over the fuse and a second region over the bonding pad;

etching the third dielectric layer in the first and second region with a first etchant until the nitride layer is removed to form apertures in the first and second region, changing to a second etchant and resuming etching in the second dielectric layer in the first and second region until the bonding pad is exposed; and putting a first group of the fuses into a first state and a second group of the fuses different from the first group of fuses into a second state, the electrical resistance of the first group of the fuses being much greater than that of the fuses in the second state.

13. The method of forming a fuse as recited in claim 12 wherein in an N metal layer process, the second-to-the-last metal layer is an $(N-1)^{th}$ metal layer and the last metal layer is an $N^{th}$ layer.

14. The method of claim 12 wherein the second-to-last and the last metal interconnect layers includes using alloys selected from the group consisting of: aluminum, copper, titanium, tungsten, platinum, molybdenum, cobalt and tantalum.

15. The method of claim 12 wherein the first dielectric layer, the second dielectric layer, and the third dielectric layer are selected from the group consisting of: silicon dioxide, silicon oxynitride, silicon nitride, silicon oxyfluoride and phospho-silicate glass.

16. The method of manufacturing a semiconductor device as recited in claim 12 wherein putting the first group of fuses into the first state comprises using a laser beam to open the first group of fuses.

17. The method of manufacturing a semiconductor device as recited in claim 12 wherein putting the first group of fuses into the first state comprises using an electrical current to open the first group of fuses.

18. A method of forming an integrated circuit having memory redundancy comprising:

forming a semiconductor array of memory cells arranged in rows and columns, with each memory cell to be accessed in response to levels established on selected ones of row and bit lines, forming a fuse-link circuit coupled to certain ones of the row and bit lines, wherein the forming of the fuse-link comprises:

forming a fuse having an insulated portion and an exposed portion;

covering the exposed portion with a first insulator;

forming a second insulator over the first insulator; and selectively removing the second insulator and exposing the first insulator via an aperture above the fuse layer, and repairing at least one defective memory cell in the array by opening the fuse-link.

19. The method as recited in claim 18 wherein forming a fuse further comprises:

forming the fuse in a second-to-the-last metal interconnect layer;

forming a first oxide layer over the fuse;

depositing a last metal interconnect layer on the first oxide layer and forming a bonding pad therefrom;

forming a second oxide layer over the bonding pad and the first oxide layer;

forming a nitride layer over the second oxide layer;

masking the nitride layer to define a first region over the fuse and a second region over the bonding pad; and etching the nitride layer in the first and second region with a first etchant until the nitride layer is removed to form apertures in the first and second region, changing to a second etchant and resuming etching in the second oxide layer in the first and second region until the bonding pad is exposed.

20. The method of forming a fuse as recited in claim 19 wherein in an N-metal layer process, the second-to-the-last metal is an $(N-1)^{th}$ metal layer and the last metal layer an $N^{th}$ metal layer wherein N is an integer greater than two.

* * * * *